(12) United States Patent
Lindner et al.

(10) Patent No.: US 9,186,877 B2
(45) Date of Patent: Nov. 17, 2015

(54) METHOD FOR STRIPPING A PRODUCT SUBSTRATE FROM A CARRIER SUBSTRATE

(71) Applicant: EV Group GmbH, St. Florian (AT)

(72) Inventors: Friedrich Paul Lindner, Scharding (AT); Jurgen Burggraf, Scharding (AT)

(73) Assignee: EV Group GmbH, St. Florian (AT)

( * ) Notice: Subject to any disclaimer, the term of this patent is extended or adjusted under 35 U.S.C. 154(b) by 0 days.

(21) Appl. No.: 14/551,474

(22) Filed: Nov. 24, 2014

(65) Prior Publication Data

US 2015/0096690 A1    Apr. 9, 2015

Related U.S. Application Data

(62) Division of application No. 14/013,145, filed on Aug. 29, 2013, now Pat. No. 8,986,496, which is a division of application No. 13/392,123, filed as application No. PCT/EP2010/005108 on Aug. 20, 2010, now Pat. No. 8,894,807.

(30) Foreign Application Priority Data

Sep. 1, 2009    (EP) ..................................... 09011198

(51) Int. Cl.
 *B32B 38/10* (2006.01)
 *B32B 43/00* (2006.01)
 (Continued)

(52) U.S. Cl.
 CPC ............... *B32B 43/006* (2013.01); *B32B 38/10* (2013.01); *B32B 43/003* (2013.01);
 (Continued)

(58) Field of Classification Search
 CPC  B32B 38/10; B32B 43/006; Y10T 156/1922; Y10T 156/1121; Y10T 156/1967; Y10T 156/1184; Y10T 156/1111

USPC .......... 156/703, 705, 754, 717, 762, 930, 941
See application file for complete search history.

(56) References Cited

U.S. PATENT DOCUMENTS

| 3,988,196 A | 10/1976 | Wanesky ....................... 156/541 |
| 5,273,615 A | 12/1993 | Asetta et al. ................... 156/510 |

(Continued)

FOREIGN PATENT DOCUMENTS

| AT | 502233 | 4/2007 | .............. H01L 21/68 |
| AT | 503053 | 7/2007 | ............ H01L 21/683 |

(Continued)

OTHER PUBLICATIONS

Int'l Preliminary Report on Patentability (including English language translation) from corresponding PCT/EP2010/005108 (Form PCT/IPEA/409), dated Feb. 14, 2012.

(Continued)

*Primary Examiner* — Mark A Osele
*Assistant Examiner* — Nickolas Harm
(74) *Attorney, Agent, or Firm* — Kusner & Jaffe

(57) ABSTRACT

Device for stripping a product substrate from a carrier substrate connected to the product substrate by an interconnect layer by means of a flexible film that is mounted on a film frame and that comprises an adhesive layer for holding the product substrate in a bonding surface section of the film, the film being mounted on the film frame in an attachment section of the film that surrounds the bonding surface section, and the film comprising a stripping section that is located between the bonding surface section and the attachment section, the device having stripping means for effecting a stripping of the product substrate from the carrier substrate from a periphery of the product substrate.

18 Claims, 3 Drawing Sheets

(51) Int. Cl.
*H01L 21/683* (2006.01)
*H01L 21/67* (2006.01)

(52) U.S. Cl.
CPC ..... *H01L 21/67132* (2013.01); *H01L 21/6835* (2013.01); *H01L 21/6836* (2013.01); *B32B 2457/14* (2013.01); *H01L 2221/6839* (2013.01); *H01L 2221/68318* (2013.01); *H01L 2221/68327* (2013.01); *H01L 2221/68381* (2013.01); *Y10S 156/93* (2013.01); *Y10S 156/941* (2013.01); *Y10S 156/942* (2013.01); *Y10T 156/11* (2015.01); *Y10T 156/1111* (2015.01); *Y10T 156/1121* (2015.01); *Y10T 156/1184* (2015.01); *Y10T 156/19* (2015.01); *Y10T 156/1922* (2015.01); *Y10T 156/1961* (2015.01); *Y10T 156/1967* (2015.01)

(56) References Cited

U.S. PATENT DOCUMENTS

| | | | |
|---|---|---|---|
| 5,688,411 A | 11/1997 | Kutsuzawa et al. | 216/92 |
| 5,800,665 A | 9/1998 | Okaniwa et al. | 156/344 |
| 6,076,585 A | 6/2000 | Klingbeil et al. | 156/701 |
| 6,090,687 A | 7/2000 | Merchant et al. | 438/455 |
| 6,342,434 B1 | 1/2002 | Miyamoto et al. | 438/464 |
| 6,435,249 B1 | 8/2002 | Komine et al. | 156/763 |
| 6,462,415 B1 | 10/2002 | Ishiguri et al. | 257/738 |
| 6,713,880 B2 | 3/2004 | Sahara et al. | 257/783 |
| 7,211,168 B2 | 5/2007 | Miyanari | 156/701 |
| 7,438,631 B2 | 10/2008 | Nagamoto et al. | 451/59 |
| 7,497,916 B2 | 3/2009 | Hayashi et al. | 156/64 |
| 7,829,152 B2 | 11/2010 | Thie et al. | 427/443.1 |
| 7,910,454 B2 | 3/2011 | Thallner | 438/455 |
| 8,349,129 B2 | 1/2013 | Blanchard et al. | 156/711 |
| 2002/0069895 A1 | 6/2002 | Struven | 134/1.3 |
| 2002/0106869 A1 | 8/2002 | Otsu et al. | 438/459 |
| 2003/0113984 A1 | 6/2003 | Okada et al. | 438/459 |
| 2004/0089397 A1 | 5/2004 | Cheng et al. | 156/ |
| 2005/0236693 A1 | 10/2005 | Kroninger et al. | 257/619 |
| 2006/0032587 A1 | 2/2006 | Hecht et al. | 156/382 |
| 2006/0148267 A1 | 7/2006 | Hansen et al. | 438/745 |
| 2007/0125751 A1 | 6/2007 | Nakamura et al. | 216/83 |
| 2007/0295458 A1 | 12/2007 | Akechi | 156/510 |
| 2009/0218050 A1 | 9/2009 | Nakamura et al. | 156/584 |
| 2009/0277591 A1 | 11/2009 | Zhao et al. | 156/584 |
| 2009/0305617 A1 | 12/2009 | Nakamura et al. | 451/365 |
| 2009/0314438 A1 | 12/2009 | Iwata et al. | 156/584 |
| 2011/0048611 A1 | 3/2011 | Carre et al. | 156/73.1 |
| 2013/0061869 A1 | 3/2013 | McCutcheon et al. | 134/1 |

FOREIGN PATENT DOCUMENTS

| | | | |
|---|---|---|---|
| CN | 1993821 A | 7/2007 | H01L 21/68 |
| DE | 4407735 | 9/1994 | H01L 21/304 |
| DE | 19734635 | 2/1999 | H01L 21/68 |
| DE | 100 48 881 | 3/2002 | H01L 21/58 |
| DE | 101 08 369 | 8/2002 | H01L 21/58 |
| DE | 103 40 409 | 4/2005 | H01L 21/00 |
| DE | 10 2004 018 250 | 11/2005 | H01L 21/68 |
| DE | 10 2006 000 687 | 7/2007 | H01L 21/673 |
| EP | 1 298 713 A1 | 4/2003 | H01L 21/304 |
| EP | 2230683 | 9/2010 | H01L 21/00 |
| JP | 06275717 | 9/1994 | H01L 21/78 |
| JP | H06268051 | 9/1994 | H01L 21/304 |
| JP | 2003-338475 | 11/2003 | H01L 21/304 |
| JP | 2004-193237 | 7/2004 | H01L 21/68 |
| JP | 2004296935 | 10/2004 | H01L 21/02 |
| JP | 2005-123382 | 5/2005 | H01L 21/304 |
| JP | 2006-032506 | 2/2006 | H01L 21/68 |
| JP | 2006-059861 A | 3/2006 | H01L 21/683 |
| JP | 2006059861 | 3/2006 | H01L 21/683 |
| JP | 2006-135272 A | 5/2006 | H01L 21/00 |
| JP | 2006-156679 | 6/2006 | H01L 21/02 |
| JP | 2007-048920 | 2/2007 | H01L 21/301 |
| JP | 2009-182067 | 8/2009 | H01L 21/683 |
| JP | 2009-182256 | 8/2009 | H01L 21/683 |
| KR | 10-2011-0003486 | 1/2011 | B32B 43/00 |
| WO | WO 02/067295 | 8/2002 | H01L 21/00 |
| WO | WO 2011/026570 | 3/2011 | H01L 21/68 |
| WO | WO 2013/036638 | 3/2013 | H01L 21/306 |

OTHER PUBLICATIONS

Pamphlet entitled: "1990 U.S. Conference on GaAs MANufacturing TECHnology—Digest of Papers," dated Apr. 1-3, 1990, Bally's Reno, Reno Nevada U.S.A., 5 pages.

Int'l Search Report (English version only) from corresponding PCT/EP2010/005108 (Form PCT/ISA/210); 4 pages, dated Oct. 8, 2010.

Int'l Search Report (English version only) from corresponding PCT/US2012/053962 (Form PCT/ISA/210); 3 pages, dated Feb. 28, 2013.

Office Action issued in the corresponding Chinese Patent Application No. 201080038912.8, dated Mar. 31, 2014 (English-language translation provided).

Office Action issued in the corresponding Japanese Patent Application No. 2012-525912, dated May 15, 2014.

Office Action issued in the corresponding Korean Patent Application No. 10-2014-7033330, dated Feb. 17, 2015.

Office Action issued in the corresponding Korean Patent Application No. 10-2014-7033331, dated Feb. 26, 2015.

METHOD FOR STRIPPING A PRODUCT SUBSTRATE FROM A CARRIER SUBSTRATE

RELATED APPLICATIONS

The present application is a divisional of U.S. application Ser. No. 14/013,145, filed Aug. 29, 2013, which is a divisional of U.S. application Ser. No. 13/392,123, filed Feb. 24, 2012 (now U.S. Pat. No. 8,894,807, issued Nov. 25, 2014), which is a U.S. National Stage Application of International Application No. PCT/EP2010/005108, filed Aug. 20, 2010, which claims priority from European Patent Application No. 09011198.0, filed Sep. 1, 2009, said patent applications hereby fully incorporated herein by reference.

FIELD OF THE INVENTION

The invention relates to a device and a method for stripping a product substrate from a carrier substrate.

BACKGROUND OF THE INVENTION

The back-thinning of product substrates is often necessary in the semiconductor industry and can take place mechanically and/or chemically. For purposes of back-thinning, in general the product substrates are temporarily fixed on a carrier, there being various methods for the fixing. The carrier material can be, for example, films, glass substrates or silicon wafers.

Depending on the carrier materials used and the interconnect layer used between the carrier and the product substrate, different methods for dissolving or destroying the interconnect layer are known, such as, for example, the use of UV light, laser beams, the action of temperature, or solvents.

Stripping increasingly constitutes one of the most critical process steps since thin substrates with substrate thicknesses of a few microns easily break during stripping/peeling or are damaged by the forces that are necessary for the stripping process.

Moreover, thin substrates have hardly any stability of shape or none at all and typically curl without support material. During handling of back-thinned wafers, therefore, fixing and support of the wafers are essentially indispensable.

SUMMARY OF THE INVENTION

Therefore, the object of this invention is to devise a device and a method to detach such a product substrate from a carrier in as nondestructive a manner as possible.

This object is achieved with the features of the independent claims. Advantageous further developments of the invention are given in the dependent claims. The framework of the invention also encompasses all combinations of at least two of the features given in the specification, the claims, and/or the figures. In the specified value ranges, values that lie within the indicated limits will also be disclosed as boundary values, and they are to be claimed in any combination.

The invention is based on the idea of further developing a generic device and a generic method by the elasticity or flexibility of a film mounted on a film frame being used to carefully strip the product substrate starting from the edge of the product substrate namely by deforming the film, especially in a stripping section of the film. In this way, the product substrate is immediately available for other process steps directly after separation and is protected by the film and the film frame. Many process steps can be carried out directly on the product substrate mounted on the film frame.

In other words: the flexible film by means of a force bordering the film frame and the adhesive layer that bonds the product substrate in the bonding surface section of the film delivers a tensile force to the product substrate, by which the product substrate is stripped, especially peeled, from the carrier substrate.

A product substrate is defined as a product substrate, for example a semiconductor wafer, which is conventionally thinned to a thickness of between 0.5 μm and 250 μm, the trend being toward thinner and thinner product substrates. This invention works especially effectively with product substrates that themselves have flexibility similar to the film mounted on the film frame. In the device according to the invention and the method according to the invention, the product substrate is peeled from the carrier substrate, especially proceeding concentrically from the periphery of the product substrate.

The carrier is, for example, a carrier substrate with a thickness of between 50 μm and 5,000 μm, especially between 500 μm and 1,000 μm.

The interconnect layer can be an adhesive, for example a soluble adhesive, especially a thermoplastic, which is applied, for example, selectively in an edge region of the carrier substrate-product substrate combination, especially in an edge zone of from 0.1 to 20 mm. Alternatively, the adhesive can be applied over the entire surface, and the adhesive force can be reduced in the center by an adhesion-reducing layer, for example a fluoropolymer, preferably Teflon.

A chuck is especially well suited as the holding means, especially a spinner chuck for holding the carrier substrate, especially by means of negative pressure, for example suction paths, holes or suction cups. Alternatively, mechanical holding, for example by lateral clamps, is conceivable. Holding takes place electrostatically in another alternative configuration.

The stripping means encompass the film mounted on the film frame and a film frame holder that applies a force and that holds the film frame.

Advantageously, in addition to the stripping means, there is a connection release means for at least partial release of the connection between the carrier substrate and the product substrate caused by the interconnect layer.

To the extent that the device has heating means for heating the carrier substrate-product substrate combination that are integrated especially into the carrier substrate holder, a thermoplastically melting adhesive can be used as an interconnect layer. The maximum heating temperature is 250° C., preferably a maximum 175° C.

In one advantageous embodiment of the invention, it is provided that the connection release means is made to work essentially without heating. In this way, it is possible to omit any heating means.

In another advantageous embodiment of the invention, it is provided that the connection release means comprises fluid means, especially a solvent that selectively dissolves the interconnect layer, for detaching the interconnect layer. Chemical dissolution of the interconnect layer is especially protective of the product substrate and with the corresponding material choice, dissolution can also take place very quickly, especially when only edge regions of the product substrate are provided with an interconnect layer, so that the solvent can act very quickly from the side. In this way, perforations in the carrier substrate and/or product substrate can be omitted.

In one alternative embodiment of the invention, it is provided that the connection release means comprises mechanical separating means, especially a blade for cutting through the interconnect layer, for detaching the interconnect layer. In this way, especially prompt separation of the product substrate from the carrier is possible. A combination of mechanical separating means and fluid means is also conceivable.

In another alternative embodiment of the invention, it is provided that the connection release means comprises a UV light source for detaching the interconnect layer. This embodiment can also be combined with the embodiment of the mechanical separating means and/or the embodiment with fluid means.

To the extent that the connection release means is made to act especially exclusively from one side edge of the product substrate, action on the product substrate and/or the carrier from the top and/or bottom, especially the inside region of the product substrate that lies within the side edge, can be omitted.

There being a rotation means for rotation of the carrier substrate, product substrate and/or film frame with the film makes it possible to omit an arrangement of the connection release means over the entire periphery of the product substrate and partial action on the periphery of the product substrate is sufficient.

To the extent that the stripping section is located outside of the outer contour of the product substrate and/or adjoins the bonding section, optimum transfer of the stripping force to the product substrate is possible by deformation of the film.

Advantageously, to expose the interconnect layer to the fluid means, for holding the fluid means there is a solvent reservoir that is fastened, especially sealed, to the carrier substrate or carrier substrate holder, the top edge of the reservoir extending at least as far as the plane formed by the product substrate. The solvent reservoir at least partially encompassing the side edge or the periphery of the product substrate allows especially effective action on the interconnect layer. Furthermore, the measure of encompassing prevents fluid means from escaping from the solvent reservoir or UV light intensity from being lost. When using mechanical separation means, possible contaminants are prevented from escaping from the solvent reservoir and contaminating the product substrate. The solvent reservoir can be made L-shaped or U-shaped in cross-section in one advantageous configuration.

In another advantageous configuration of the invention, it is provided that the solvent reservoir extends only over one peripheral sector of the side edge or the periphery of the product substrate. Advantageously, the solvent reservoir extends only slightly over the side edge or periphery of the carrier substrate or product substrate in the direction of the product substrate center so that a force Fs can be applied to the carrier substrate. The force Fs can also be transferred to the carrier substrate via the solvent reservoir.

According to one advantageous embodiment of the invention, it is provided that stripping results by a force Fs that acts on the carrier substrate and a force Ff that acts on the film frame and that is directed against the force Fs. The device can be made to deliver the force Ff as a local force, especially in spots at at least one point on the film frame. Advantageously, the force Ff is delivered distributed among several points on the periphery of the film frame, whereby different forces can also be delivered and tilting of the film frame relative to the carrier substrate or the carrier substrate holder can be caused by the device.

A uniform force distribution on the periphery of the product substrate depending on the desired form of stripping is achieved by the capacity of the film to be deformed, especially stretched, by the force Fs and the force Ff in the stripping section.

According to another advantageous embodiment of the invention, it is provided that the force Fs and the force Ff can cause displacement of the film frame relative to the carrier substrate, whereby in this way within the film frame a trough being formed that has acoustic wave generating means, especially formed from a fluid that can be held in the trough and an acoustic transmitter immersed in the fluid, for transmission of acoustic waves to the product substrate and/or the solvent. The stripping of the product substrate is greatly accelerated by the cavitation generated by ultrasound or megasound so that the stripping takes place much more carefully and at the same time more rapidly.

Advantageously, it is furthermore provided that the stripping of the product substrate takes place concentrically from the periphery of the product substrate to the center of the product substrate.

It is especially advantageous if the product substrate is made to adhere to the film during the stripping process since in this way, blanket holding and protection are ensured.

Other advantages, features and details of the invention will become apparent from the following description of preferred embodiments and based on the drawings.

DETAILED DESCRIPTION OF THE INVENTION

In the figures, the same components and components with the same function are identified with the same reference number.

Figure 1A:
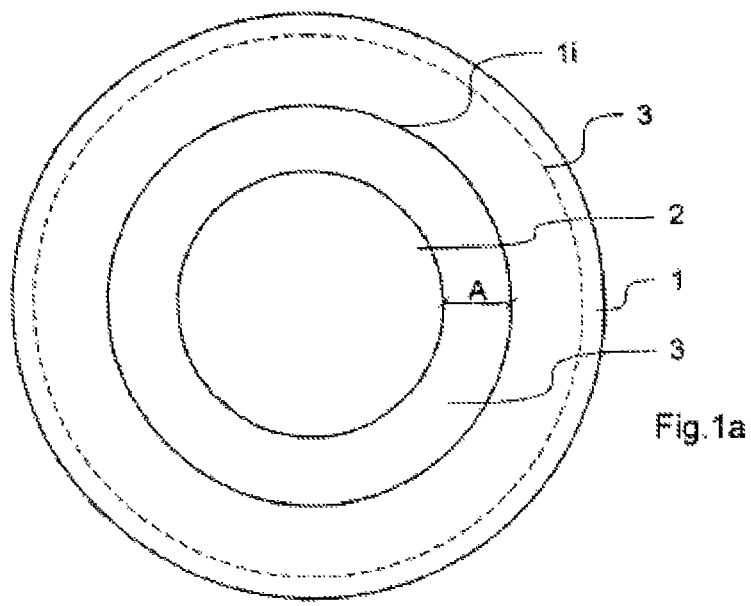
FIG. 1a shows a schematic top view of a substrate combination consisting of the product substrate, the carrier substrate and the interconnect layer on a film frame.

FIG. 1a shows a film frame 1 that is round in this embodiment at least on an inner periphery 1i, with a film 3 mounted, especially glued, on its bottom. With a radial distance to the inner periphery 1i of the film frame 1, within the film frame 1 a product substrate-carrier substrate combination is glued on an adhesive layer 3s of the film 3 concentrically to the film frame 1 (see FIG. 1b).

The product substrate-carrier substrate combination consists of a product substrate 4 that adheres to the film 3, a carrier substrate 2, and an interconnect layer 6 that connects the product substrate 4 and the carrier substrate 2. The diameters of the product substrate 4 and of the carrier substrate 2 are essentially identical, while the thickness of the product substrate 4 is less than the thickness of the carrier substrate 2.

The film 3 consists of an attachment section 3b that has the shape of a circular ring in this case and in which the film 3 is fixed to the film frame 1. Furthermore, the film 3 consists of a bonding surface section 3k in which the product substrate 4 can be fixed on the adhesive layer 3s of the film 3. Between the attachment section 3b and the bonding surface section 3k, there is a stripping section 3a that is located especially concentrically to the attachment section 3b and the bonding surface section 3k, and that has a function that is critical according to the invention. The stripping section 3a thus extends from a periphery 4u of the product substrate 4 to the inner periphery 1i of the film frame, here labeled distance A. The ratio between a thickness D of the film frame 1 and the distance A is advantageously at least 1 to 2 to 1 to 50, especially 1 to 5 to 1 to 25, and preferably 1 to 19 to 1 to 10.

Figure 1B:
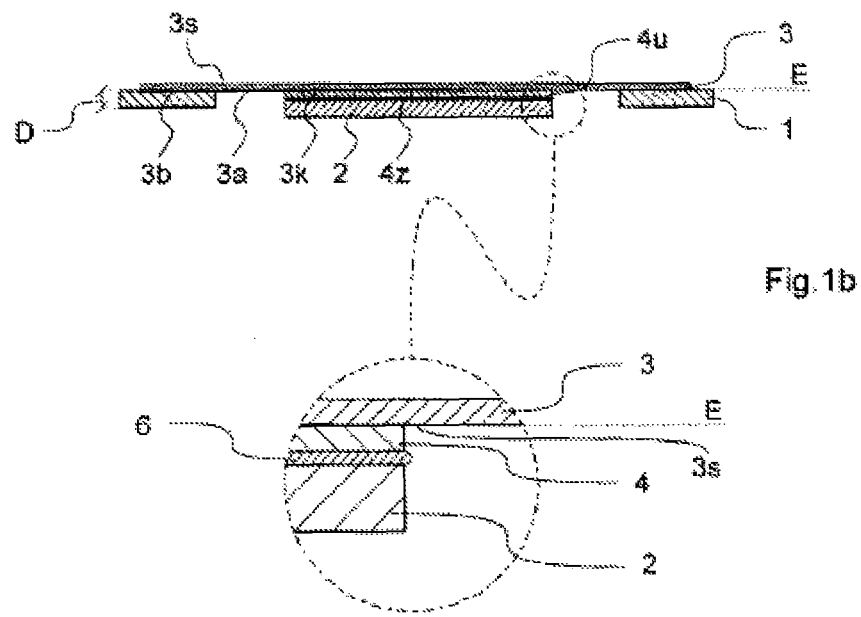
FIG. 1b shows a schematic side view to FIG. 1a with a detailed view.

In the initial position shown in FIG. 1b, the side of the product substrate 4 that makes contact with the film 3 and the side of the film frame 1 that makes contact with the film 3 are arranged flush in one plane E. The parts shown in FIGS. 1a and 1b are assembled on a known film frame mounter.

Figure 2:
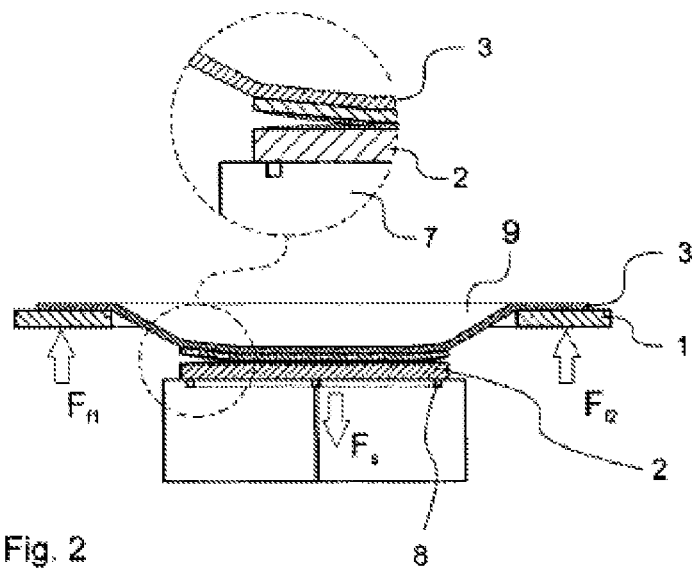
FIG. 2 shows a schematic representation of the device according to the invention in the stripping of the product substrate from the carrier substrate with a detailed view.
Figure 3:
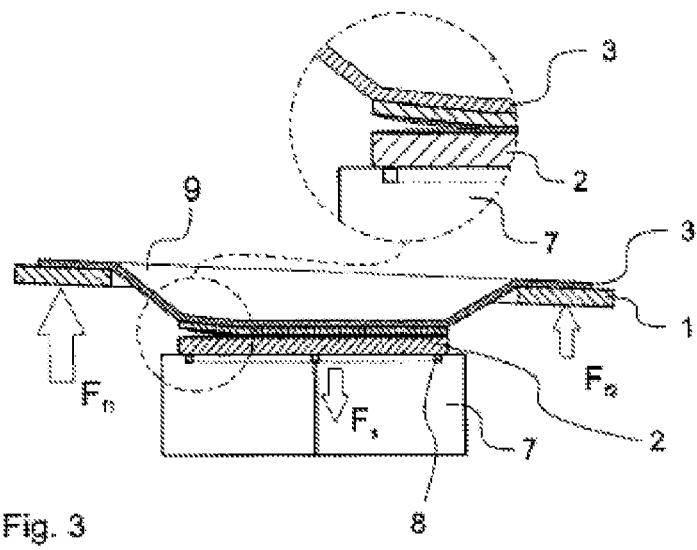
FIG. 3 shows a schematic representation of the device according to the invention in the stripping of the product substrate from the carrier substrate with a detailed view.

FIGS. 2 and 3 schematically show the stripping process in two variants, namely shortly after the start of the stripping of the product substrate 2 from the carrier substrate 4.

By delivering opposing forces Ff, or Ff1 and Ff2, and Fs, the product substrate-carrier substrate combination and the bonding surface section 3k of the film 3, which section adheres to the combination, are moved out of the film frame 1 in the direction of a carrier substrate holder 7. In a kinematic reversal, the film frame 1 can also be moved by the force Ff by means of a film frame holder that is not shown, for example a robot arm.

The force is transferred from the carrier substrate holder 7 to the carrier substrate 2 via vacuum paths 8 that have been machined into the surface of the carrier substrate holder 7 and via a vacuum means that is connected to them and that is not shown. The carrier substrate holder 7 is anchored securely to the device.

Alternatively, the holding of the carrier substrate 2 can take place mechanically, for example by clamping, or electrostatically.

The force Ff acting on the film frame 1—as shown in FIG. 2—can act uniformly distributed as a superficial force on the film frame 1 so that the stripping of the product substrate 4 from the carrier substrate 2 takes place from the edge by way of deformation of the stripping section 3a, as is shown enlarged in the detailed representation in FIG. 2. The force Ff1 is identical here to the force Ff2. The force can be delivered in spots distributed on the periphery of the film frame 1 or can be introduced distributed by a film frame holder.

In the embodiment shown in FIG. 3, the force distribution on the periphery of the film frame 1 is different, specifically the force Ff1 is greater than the force Ff2 on the opposite side so that the product substrate 4 is stripped first on the side on which the greater force Ff1 is delivered. The holding means for delivering the force into the film frame 1 must therefore be made to allow tipping of the film frame 1.

The product substrate 4 promotes stripping since it behaves in an elastic manner that is similar to the film 3 and is thus detached from the product substrate-carrier substrate combination step by step from its edge.

Figure 4:
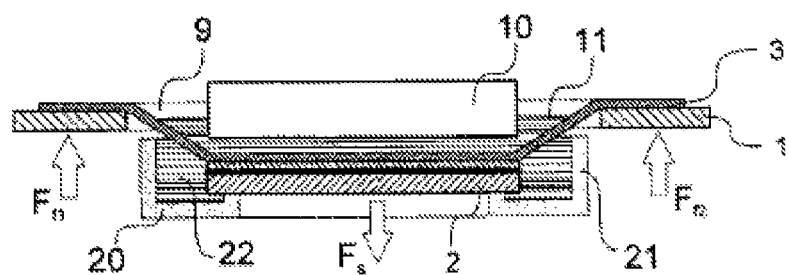
FIG. 4 shows a schematic representation of one embodiment of the invention.

According to FIG. 4, the solvent reservoir 20 is arranged on the carrier substrate 2 such that immersion of the product substrate-carrier substrate combination in the position of the product substrate-carrier substrate combination exposed to a force is enabled. The solvent reservoir 20 is attached annularly in this case to the periphery of the carrier substrate 2, especially to form a seal, so that the force can be delivered, as before, within the solvent reservoir 20 to the carrier substrate 2. The force can also be delivered alternatively to the solvent reservoir 20, for example when the solvent reservoir 20 is attached nonpositively to the carrier substrate 2. An outer peripheral wall 21 of the solvent reservoir 20 extends at least as far as a plane formed by the product substrate 4 so that the solvent 22 in the solvent reservoir 20 reaches at least as far as the interconnect layer 6, and the latter can be dissolved by the solvent 22. Advantageously, the outer peripheral wall 21 extends beyond the plane formed by the product substrate 4 almost as far as the film frame 1 so that even during rotation, escape of the solvent 22 from the solvent reservoir 20 is avoided as much as possible.

This measure supports stripping, especially peeling of the product substrate 4 from the carrier substrate 2, by the interconnect layer 6 being dissolved from the periphery 4u of the product substrate 4 and the product substrate 4 being carefully lifted by the tensile force applied to the periphery 4u deforming the film 3.

The deformation of the film 3 causes a trough 9. The delivery of a fluid 11 into the trough 9 is made for transmission of acoustic waves (ultrasound, megasound) via the film 3 into the solvent 22 located opposite the film 3 and into the product substrate-carrier substrate combination by means of an acoustic wave generating means, here an acoustic transmitter 10. The solvent 22 acts in an accelerated manner on the interconnect layer 6 by the delivery of sound from the edge so that the return force of the film 3 in the direction of the film frame 1 can be reduced and/or stripping is supported, especially for radially symmetrical stripping according to FIG. 2.

The delivery of sound causes the molecules of the solvent 22 to vibrate, resulting in cavitation; this leads to distinct acceleration of the dissolution of the interconnect layer 6.

The solvent 22 is advantageously matched selectively to the interconnect layer 6, and the adhesive layer 3s cannot be attacked by the solvent 22.

REFERENCE SYMBOL LIST

A Distance
D Thickness
E Plane
1 Film frame
1i Inner periphery
2 Carrier substrate
3 Film
3a Stripping section
3b Attachment section
3k Bonding surface section
3s Adhesive layer
4 Product substrate
4u Periphery
6 Interconnect layer
7 Carrier substrate holder
8 Vacuum paths
9 Trough
10 Acoustic transmitter
11 Fluid
20 Solvent reservoir
21 External peripheral wall
22 Solvent Having described the invention, the following is claimed:

1. Method for stripping a product substrate from a carrier substrate, the carrier substrate connected to the product substrate by an interconnect layer, the method including the steps of:
providing
a flexible film having an upper surface and a lower surface, the flexible film including a bonding surface section on the lower surface, an adhesive layer disposed on the bonding surface section for holding the product substrate to the bonding surface section of the flexible film, an attachment section on the lower surface of the flexible film wherein the attachment section surrounds an outer periphery of the bonding surface section and a stripping section located between the bonding surface section and the attachment section, and a film frame mounted to the flexible film at the attachment section;

applying a fluid only to an outer periphery of the interconnect layer for at least partial detachment of the interconnect layer; and stripping the product substrate from the carrier substrate from at least a periphery of the product substrate.

2. Method according to claim 1, wherein the step of stripping takes place concentrically from the periphery of the product substrate to the center of the product substrate.

3. Method according to claim 1, wherein the fluid is a solvent that dissolves the interconnect layer.

4. Method according to claim 1, wherein said step of applying a fluid includes:

providing an annular-shaped solvent reservoir for holding the fluid, and attaching the solvent reservoir to an annular portion of the carrier substrate wherein a top edge of the solvent reservoir extends coplanar to an upper surface of the product substrate.

5. Method according to claim 4, wherein said step of applying a fluid further includes:

moving the bonding surface section of the flexible film relative to the attachment section of the flexible film such that the bonding surface section is positioned below the attachment section.

6. Method according to claim 1, wherein said step of stripping includes:

cutting the periphery of the interconnect layer with a blade.

7. Method for stripping a product substrate from a carrier substrate, the carrier substrate connected to the product substrate by an interconnect layer, the method including the steps of:

providing a flexible film having an upper surface and a lower surface, the flexible film including a bonding surface section on the lower surface, an adhesive layer disposed on the bonding surface section for holding the product substrate to the bonding surface section of the flexible film, an attachment section on the lower surface of the flexible film wherein the attachment section surrounds an outer periphery of the bonding surface section and a stripping section located between the bonding surface section and the attachment section, and a film frame mounted to the flexible film at the attachment section;

applying a fluid only to a periphery of the interconnect layer for at least partial detachment of the interconnect layer; and stripping the product substrate from the carrier substrate concentrically from the periphery of the product substrate.

8. Method according to claim 7, wherein the fluid is a solvent that dissolves the interconnect layer.

9. Method according to claim 7, wherein said step of applying a fluid includes:

providing an annular-shaped solvent reservoir for holding the fluid, and attaching the solvent reservoir to an annular portion of the carrier substrate wherein a top edge of the solvent reservoir extends coplanar with an upper surface of the product wafer.

10. Method according to claim 9, wherein said step of applying a fluid further includes:

moving the bonding surface section of the flexible film relative to the attachment section of the flexible film such that the bonding surface section is positioned below the attachment section.

11. Method according to claim 7, wherein said step of stripping includes:

cutting the periphery of the interconnect layer with a blade.

12. Method for stripping a product substrate from a carrier substrate, the carrier substrate connected to the product substrate by an interconnect layer, the method including the steps of:

providing a flexible film having an upper surface and a lower surface, the flexible film including a bonding surface section on the lower surface, an adhesive layer disposed on the bonding surface section for holding the product substrate to the bonding surface section of the flexible film, an attachment section on the lower surface of the flexible film wherein the attachment section surrounds an outer periphery of the bonding surface section and a stripping section located between the bonding surface section and the attachment section, and a film frame mounted to the flexible film at the attachment section;

applying a fluid only to a periphery of the interconnect layer for at least partial detachment of the interconnect layer; and stripping the product substrate from the carrier substrate from a periphery of the product substrate by applying a first force to the carrier substrate and a second force to the film frame, the first force acting in a direction generally opposite to a direction of the second force.

13. Method according to claim 12, wherein the fluid is a solvent that dissolves the interconnect layer.

14. Method according to claim 12, wherein the degree of the first force is equal to the degree of the second force.

15. Method according to claim 12, wherein the second force is distributed on an outer periphery of the film frame.

16. Method according to claim 12, wherein said step of applying a fluid includes:

providing an annular-shaped solvent reservoir for holding the fluid, and attaching the solvent reservoir to an annular portion of the carrier substrate wherein a top edge of the solvent reservoir extends coplanar with an upper surface of the product wafer.

17. Method according to claim 16, wherein said step of applying a fluid further includes:

moving the bonding surface section of the flexible film relative to the attachment section of the flexible film such that the bonding surface section is positioned below the attachment section.

18. Method according to claim 12, wherein said step of stripping includes:

cutting the periphery of the interconnect layer with a blade.

* * * * *